United States Patent
Mobin et al.

(10) Patent No.: US 7,738,605 B2
(45) Date of Patent: Jun. 15, 2010

(54) METHOD AND APPARATUS FOR ADJUSTING RECEIVER GAIN BASED ON RECEIVED SIGNAL ENVELOPE DETECTION

(75) Inventors: Mohammad S. Mobin, Orefield, PA (US); Gregory W. Sheets, Bangor, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 1072 days.

(21) Appl. No.: 11/318,953

(22) Filed: Dec. 23, 2005

(65) Prior Publication Data

US 2007/0147555 A1  Jun. 28, 2007

(51) Int. Cl.
*H04L 27/08* (2006.01)
(52) U.S. Cl. ............... 375/345; 375/316; 330/254; 330/278; 455/232.1; 455/245.1
(58) Field of Classification Search ............ 375/316, 375/345; 455/232.1, 245.1; 340/254, 278
See application file for complete search history.

(56) References Cited

U.S. PATENT DOCUMENTS

| | | | | |
|---|---|---|---|---|
| 5,117,201 A | * | 5/1992 | Luther | ............... 330/279 |
| 5,881,039 A | * | 3/1999 | Sano et al. | ............... 369/59.15 |
| 2002/0085656 A1 | | 7/2002 | Lee et al. | |

* cited by examiner

*Primary Examiner*—Ted M Wang
(74) *Attorney, Agent, or Firm*—Ryan, Mason & Lewis, LLP

(57) ABSTRACT

Methods and apparatus are provided for adjusting receiver gain based on received signal envelope detection. The gain of a received signal is adjusted by obtaining a plurality of samples of the received signal for a given unit interval; determining an amplitude of the received signal based on the samples; and adjusting a receiver gain based on the determined amplitude. The received signal can be sampled, for example, using a plurality of latches. The value of the received signal can then be estimated by evaluating one or more of the latch values. Once the amplitude of the received signal is determined, one or more latches can be positioned at a desired target amplitude and the receiver gain can be adjusted until the amplitude of the received signal is within a desired tolerance of the specified target value.

17 Claims, 5 Drawing Sheets

METHOD AND APPARATUS FOR ADJUSTING RECEIVER GAIN BASED ON RECEIVED SIGNAL ENVELOPE DETECTION

FIELD OF THE INVENTION

The present invention is related to techniques for adjusting the gain of a received signal and, more particularly, to techniques for adjusting the gain of a received signal based on an envelope detection of the received signal.

BACKGROUND OF THE INVENTION

Transmitters and receivers in many communication systems employ gain control techniques to adjust the signal levels of various amplifier stages. Analog and digital automatic gain control (AGC) circuits are well-known in the art. For example, AGC circuits are frequently used in transmitters or receivers in the field of cellular, wireless, and spread-spectrum wireless communication systems.

The AGC function may be employed to bring a newly acquired signal at the input of the receiver into the dynamic range of the receiver when a communication link is first established. Thereafter, the AGC function typically continually adjusts the overall receiver gain to compensate for fluctuations in received signal strength associated with fading, interference, periods of "silence" between data frames, or similar interruptions of the signal level.

Such gain control circuitry is often employed to maintain a constant level in the front end of a receiver, including the amplification and RF/IF demodulation stages. The constant level is maintained such that the output (demodulated) baseband signal level of the receiver remains within well-defined limits, even though many factors may vary gain levels within each component of the front end.

Typically, gain control problems were solved using analog receive signal strength detectors, rectification and averaging techniques, or other control loops based on signal amplitude or energy averaging. Receive signal strength detectors, however, require expensive circuits and control loops that are prone to steady state oscillation. A need therefore exists for improved methods and apparatus for automatic gain control. A further need exists for techniques for adjusting the gain of a received signal based on received signal envelope detection.

SUMMARY OF THE INVENTION

Generally, methods and apparatus are provided for adjusting receiver gain based on received signal envelope detection. According to one aspect of the invention, the gain of a received signal is adjusted by obtaining a plurality of samples of the received signal for a given unit interval; determining an amplitude of the received signal based on the samples; and adjusting a receiver gain based on the determined amplitude. The received signal can be sampled, for example, using a plurality of latches. The value of the received signal can then be estimated by evaluating one or more of the latch values.

In one exemplary embodiment, a data eye monitor measures the received signal along the time axis to determine the location of the zero crossing points. Thereafter, the mid-point between two adjacent zero crossing points can be established. For an exemplary sinusoidal signal, the mid-point between two adjacent zero crossing points is generally associated with the location of maximum amplitude. The established mid-point can then be used by the data eye monitor to measure the maximum amplitude of the received signal. A latch can be programmed to move vertically along the amplitude axis to determine the maximum amplitude. Once the maximum amplitude is determined, the latch can optionally be positioned at a desired target amplitude and the receiver gain can be adjusted until the measured amplitude of the received signal is within a desired tolerance of the specified target value.

A more complete understanding of the present invention, as well as further features and advantages of the present invention, will be obtained by reference to the following detailed description and drawings.

DETAILED DESCRIPTION

The present invention provides methods and apparatus for adjusting the gain of a received signal based on received signal envelope detection. According to one exemplary embodiment of the invention, the envelope detection is performed using a data eye monitor. The exemplary data eye monitor may be implemented, for example, using the techniques described in U.S. patent application Ser. No. 11/095,178, filed Mar. 31, 2005, entitled "Method and Apparatus for Monitoring a Data Eye in a Clock and Data Recovery System," incorporated by reference herein. Generally, one or more latches associated with the exemplary data eye monitor are used to determined the amplitude of the received signal. The threshold voltage of the latch(es) can be used to establish a target amplitude, and the receiver gain is adjusted until the measured amplitude is within a predefined tolerance of the target amplitude.

Figure 1:
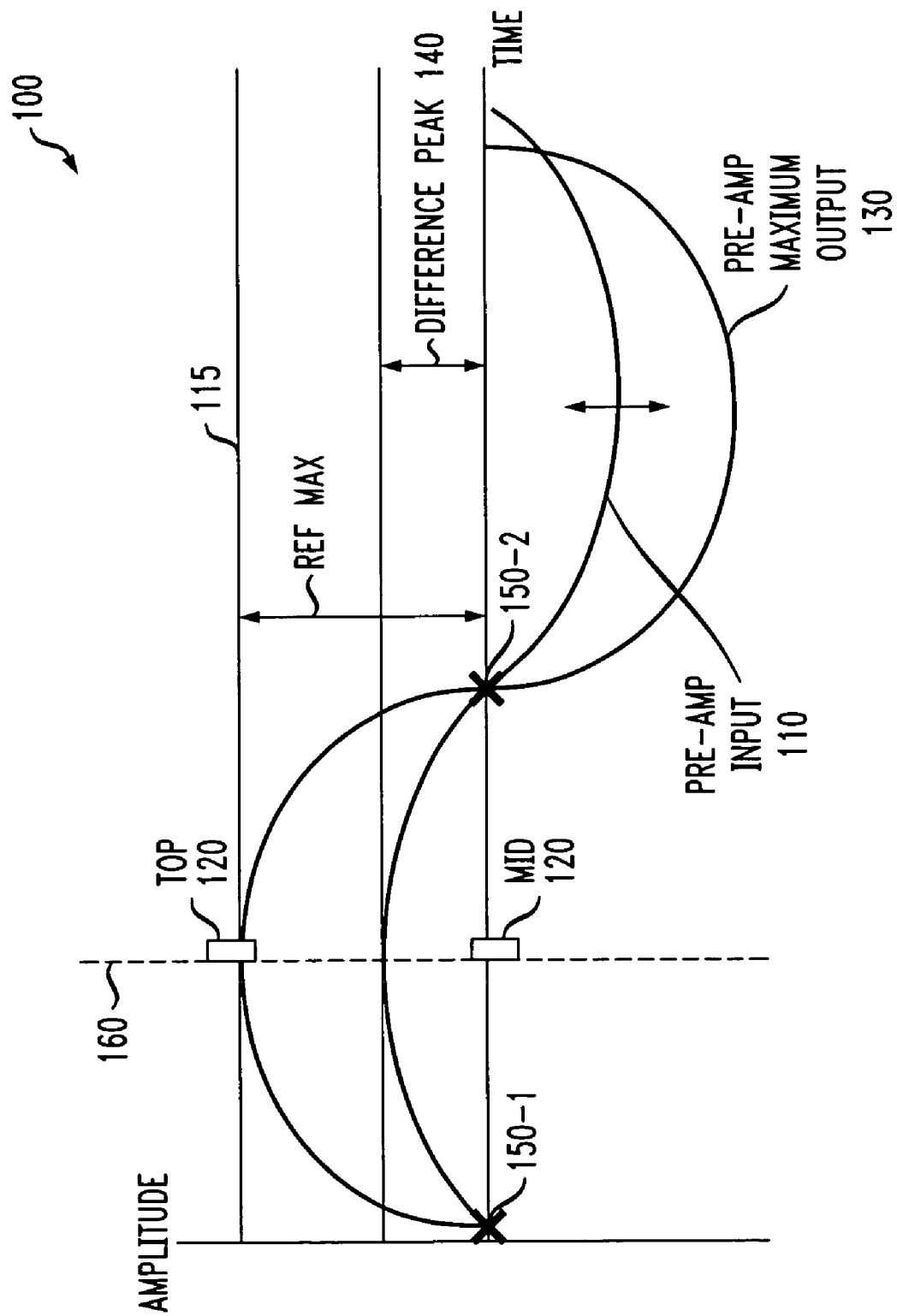
FIG. 1 graphically illustrates a measured envelope of a received signal relative to one or more roaming latch thresholds in accordance with the present invention.

FIG. 1 graphically illustrates a measured envelope of a received signal 110 relative to one or more roaming latch thresholds 120. As shown in FIG. 1, the received signal 110, measured, for example, at the input to the receiver pre-amplifier (not shown in FIG. 1), is sampled by one or more roaming latches 120-top, 120-mid, discussed further below, to determine whether the gain of the received signal needs to be adjusted. The top latch 120-top can be positioned up to a desired maximum received signal level 115, Ref Max. The gain of the received signal can thus be adjusted up to a maximum level 115. In other words, the signal 130 illustrates the maximum peak-to-peak data eye opening of the output of the pre-amplifier.

According to one aspect of the present invention, the amplitude of the received signal 110 can be determined based on the relative measurements of the two latches 120-top, 120-mid. As discussed further below, the receiver gain can be adjusted until the amplitude of the measured received signal 110 is in a desired range. In one exemplary implementation, the threshold voltage of the top latch 120-top can be used to establish a target amplitude, and the receiver gain is adjusted until the measured amplitude is within a predefined tolerance of the target amplitude.

It is noted that in the exemplary embodiment shown in FIG. 1, if the received signal level is above the threshold setting of the top latch 120-top, the actual magnitude of the received signal cannot be determined (only that the signal amplitude exceeds the threshold of the top latch 120-top). As discussed further below in conjunction with FIG. 5, when the received signal level is above the threshold setting of the top latch 120-top in this manner, the gain of the received signal is reduced until, for example, the top latch 120-top starts to record alternating binary values (101010 . . . ), indicating that the amplitude of the received signal is now at the threshold level of the latch. Likewise, as discussed further below in conjunction with FIG. 6, when the received signal level is below the threshold setting of the top latch 120-top, the gain of the received signal is increased until, for example, the top latch 120-top starts to record alternating binary values (01010 . . . ), indicating that the amplitude of the received signal is now at the threshold level of the latch.

As discussed further below in conjunction with FIG. 8, in one exemplary embodiment, the data eye monitor measures the received signal 110 along the time axis to determine the location of the zero crossing points 150-1, 150-2. Thereafter, the mid-point 160 between two adjacent zero crossing points 150-1, 150-2 can be established. It is noted that the mid-point between two adjacent zero crossing points 150-1, 150-2 is generally associated with the location of maximum amplitude, for a sinusoidal signal. The established mid-point 160 can then be used by the data eye monitor to measure the maximum amplitude of the received signal 110. In one exemplary implementation, the top latch 120-top is programmed to move vertically along the amplitude axis to determine the maximum amplitude, as discussed below in conjunction with FIG. 4. Once the maximum amplitude is determined, the top latch 120-top can optionally be positioned at the desired target amplitude and the receiver gain can be adjusted until the maximum amplitude of the received signal, as measured by the data eye monitor, is within a desired tolerance of the specified target value.

Figure 2:
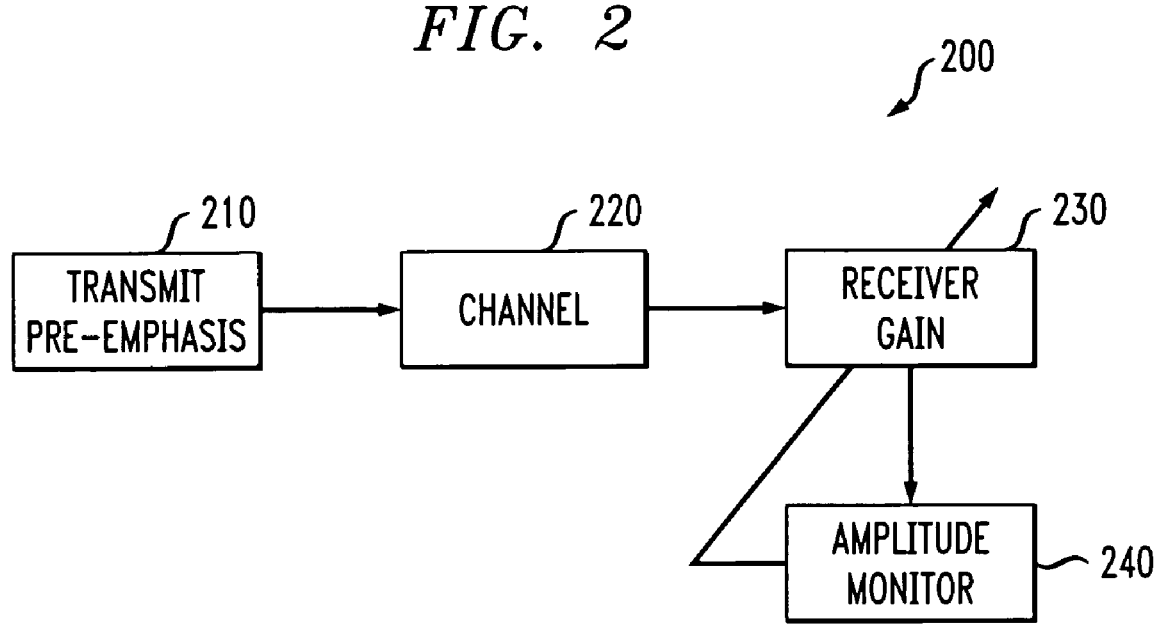
FIG. 2 illustrates an exemplary signal flow for an AGC operation in accordance with the present invention.

FIG. 2 illustrates an exemplary signal flow 200 for an AGC operation in accordance with the present invention. As shown in FIG. 2, a transmitter optionally applies a pre-emphasis to the transmitted signal during stage 210, for example, to establish the transmitted signal within a specified range. Thereafter, the signal is transmitted across a channel 220 to a receiver 230 having an adjustable gain. The gain of the receiver 230 is adjusted in accordance with the present invention based on a received signal envelope detection technique implemented by an amplitude monitor 240, discussed hereinafter.

In one exemplary implementation, the AGC scheme initially measures the input signal strength using a unity gain. If the input signal saturates at unity gain, the receiver pre-amplifier gain at stage 240 is iteratively reduced until the amplitude of the input signal is within a desired range. On the other hand, if the input signal is weak, the receiver pre-amplifier gain at stage 240 is iteratively increased until the amplitude of the input signal is within a desired range. The iterative process continues, for example, until the amplitude peak aligns with the maximum reference or a predefined upper bound of the pre-amplifier output specification, or until the gain range is exceeded.

Figure 3:
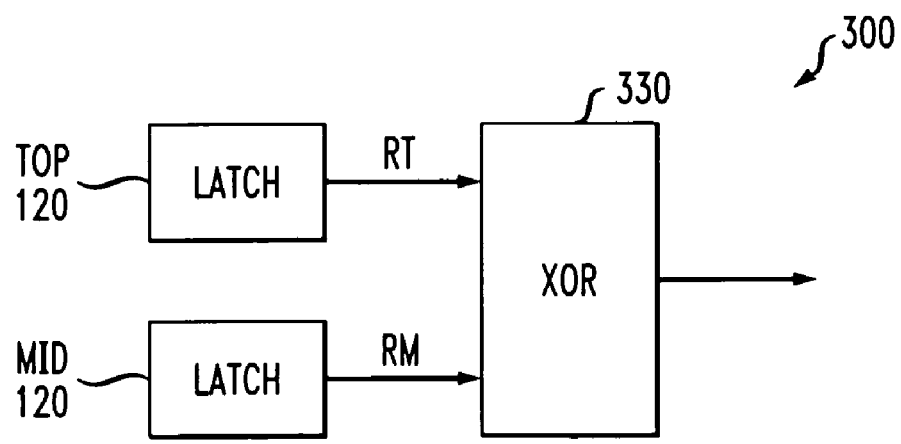
FIG. 3 is a schematic block diagram of a received signal envelope detector 300 of FIG. 2 according to the present invention.

FIG. 3 is a schematic block diagram of a received signal envelope detector 300 according to the present invention. As shown in FIG. 3, the received signal envelope detector 300 measures the data signal eye. The latches 120-top, 120-mid obtain two samples, roaming top (RT) and roaming middle (RM), obtained by sampling the received signal with controlled sampling time and threshold settings, as discussed below. The output of the latches 120 are applied to an exclusive OR (XOR) gate 330, as shown in FIG. 3. The XOR gate 330 compares the value of the center latch RM to the value of the top latch RT. If the values of the center latch RM and top latch RT match, the XOR gate 330 will generate a binary value of 0 and if the values of the center latch RM and top latch RT do not match, the XOR gate 330 will generate a binary value of 1, in a known manner. Thus, a "hit" occurs for points above the zero crossing when the values of the center latch RM and top latch RT do not match.

Generally, the amplitude monitor 240 of FIG. 2 determines whether or not the value of the center latch RM shown in FIG. 3 matches the value of the top latch, RT, and makes a corresponding adjustment to the receiver gain 230 (FIG. 2). The relative value of the latches RT and RM provides an indication of location of the data transitions (rising and/or falling edges), as well as the maximum amplitude of the received signal 110. If the center latch RM has the same value as the top latch RT, they are said to match. Thus, for samples taken inside a data eye, it would be expected that the value of the center latch RM matches the value of the top latch, RT. For samples taken along the boundary of the data eye, it would be expected that some of the values of the center latch RM will match some of the values of the top latch, RT. For samples taken outside a data eye, it would be expected that the value of the center latch RM will not match the value of the top latch, RT.

Figure 4:
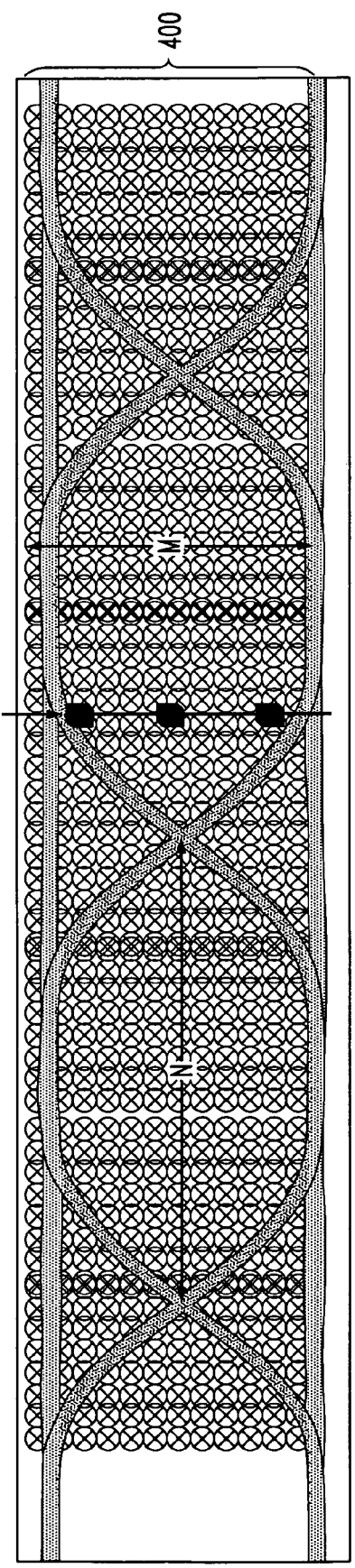
FIG. 4 illustrates the monitoring of a data signal in accordance with one embodiment of the present invention.

FIG. 4 illustrates the monitoring of a data signal in accordance with one embodiment of the present invention. As shown in FIG. 4, the roaming latches RT, RM of FIG. 3 can be programmed to move horizontally and vertically to provide N×M roaming latch options, with N latch time setting options per data eye having a time orientation (e.g., horizontal) and M latch threshold setting options per data eye having a voltage orientation (e.g., vertical). In this manner, the data signal can be sampled over N×M positions to obtain an accurate visualization of the transitions 150. In one exemplary embodiment, there are N=64 steps in the horizontal direction and M=128 steps in the vertical direction (64 steps above the zero crossing and 64 steps below the zero crossing).

Figure 5:
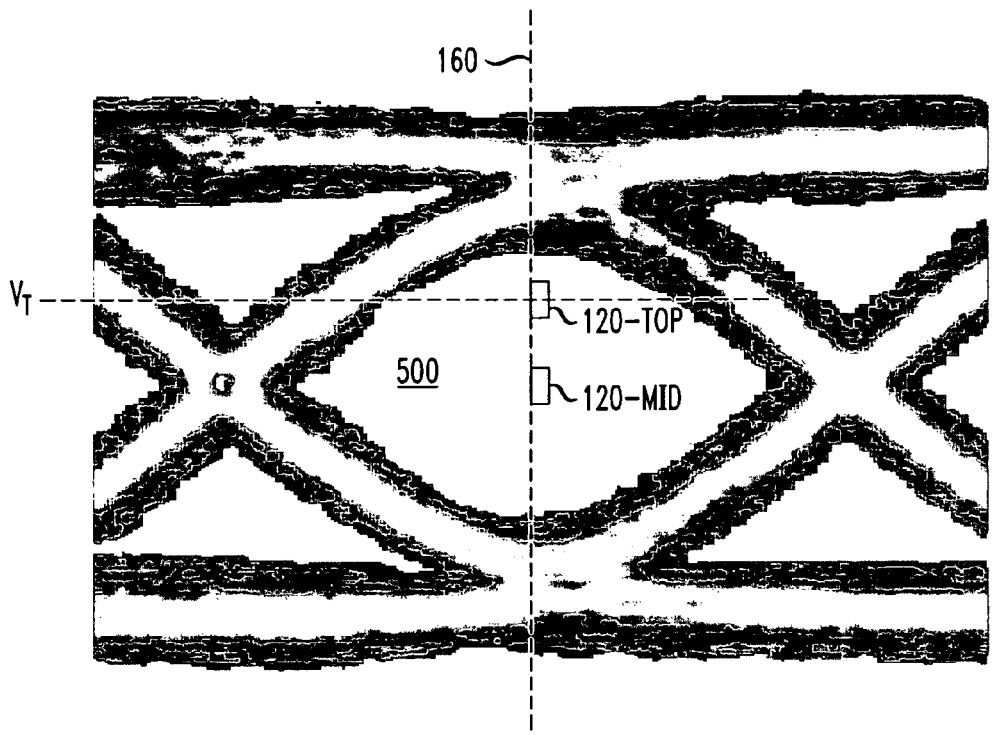
FIGS. 5 and 6 illustrate the situation where the received signal level is above and below, respectively, the threshold setting of the top latch of FIG. 1.

FIG. 5 illustrates the situation where the received signal level is above the threshold setting of the top latch of FIG. 1. Initially, the threshold voltage, $V_T$, of the top latch 120-top is set to the target voltage, $V_T$. As shown in FIG. 5, the received signal level is measured to be above the threshold setting of the top latch 120-top. Thus, the gain of the received signal must be reduced until for example, some of the values of the top latch 120-top are binary one and some of the values are binary zero (indicating that the samples are being taken along the boundary of the data eye 500). For example, the top latch 120-top may start to record alternating binary values (101010 . . . ), indicating that the amplitude of the received signal is now at the threshold level of the latch.

Figure 6:
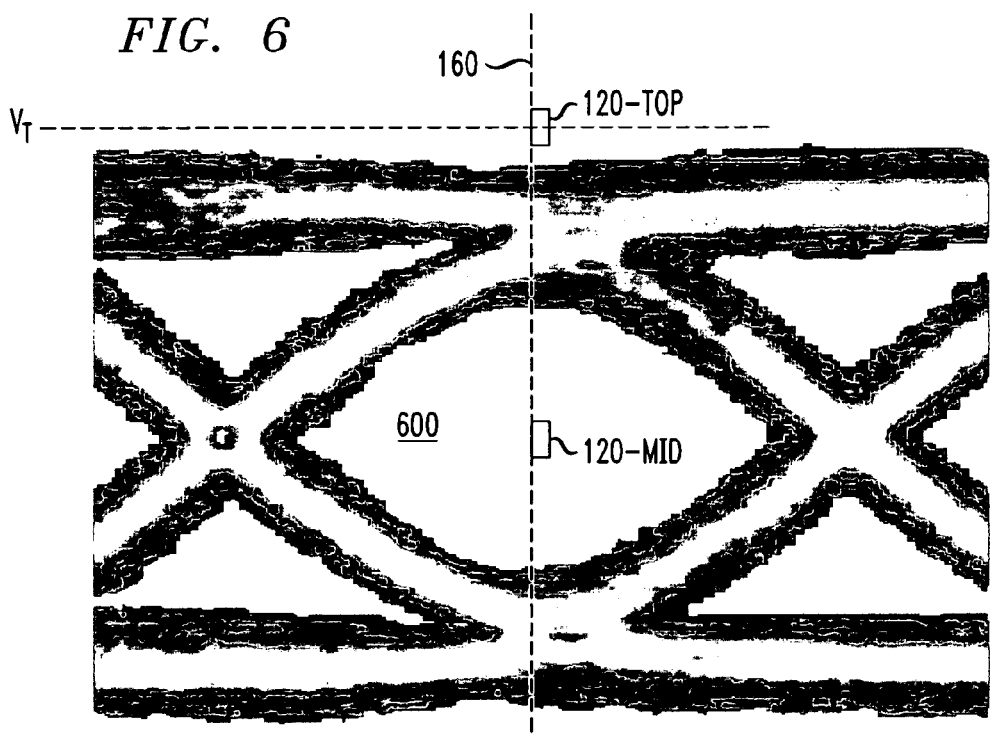

FIG. 6 illustrates the situation where the received signal level is below the threshold setting of the top latch of FIG. 1. Initially, the threshold voltage, $V_T$, of the top latch 120-top is again set to the target voltage, $V_T$. As shown in FIG. 6, the received signal level is measured to be below the threshold setting of the top latch 120-top. Thus, the gain of the received signal must be increased until, for example, some of the values of the top latch 120-top are binary one and some of the values are binary zero (indicating that the samples are being taken along the boundary of the data eye 600). For example, the top latch 120-top may start to record alternating binary values (0101010 . . . ), indicating that the amplitude of the received signal is now at the threshold level of the latch.

Figure 7:
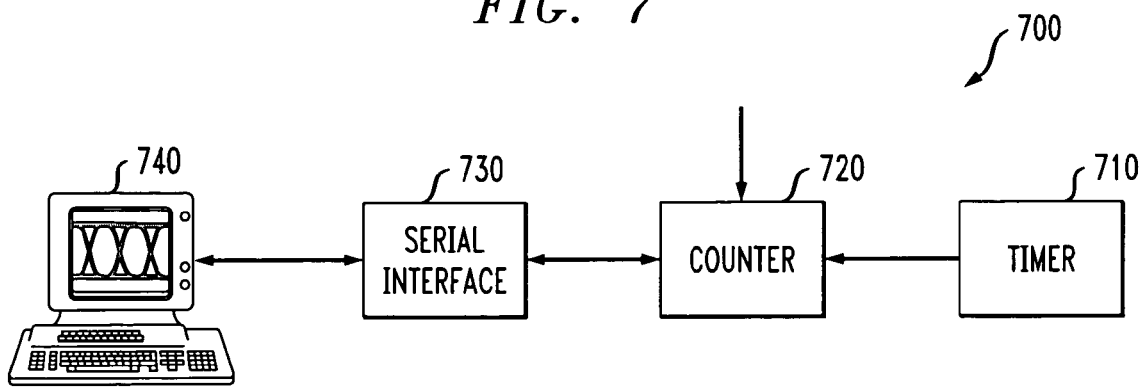
FIG. 7 is a schematic block diagram illustrating a test control system for monitoring the skew of a parallel bus.

FIG. 7 is a schematic block diagram illustrating a test control system 700 for performing received signal envelope detection. In one exemplary implementation, the latches RT, RM are stepped through each of the N horizontal positions associated with a given eye. Once the zero crossing points 150 (FIG. 1) are identified, the midpoint 160 associated with the center of the data eye can be established. The roaming latch RT is then stepped through each of the M vertical levels of the determined middle point 160 to measure the maximum amplitude. For each sampled location, the value of the roaming latch RT is evaluated for a predefined duration, controlled by a timer 710. In one exemplary implementation, for each sampled location, a counter 720 counts the number of mismatches during the predefined duration between the center latch RM and the top latch, RT. The count metric generated by the counter 720 is provided, for example, via a serial interface 730 to a computing device 740, such as a personal computer or an 8051 microprocessor, for further analysis. Generally, once the sampled data is loaded into the computing device 740, the data can be analyzed and the received signal envelope can be obtained and the gain adjusted by controlling, for example, the receiver pre-amplifier gain setting.

Figure 8:
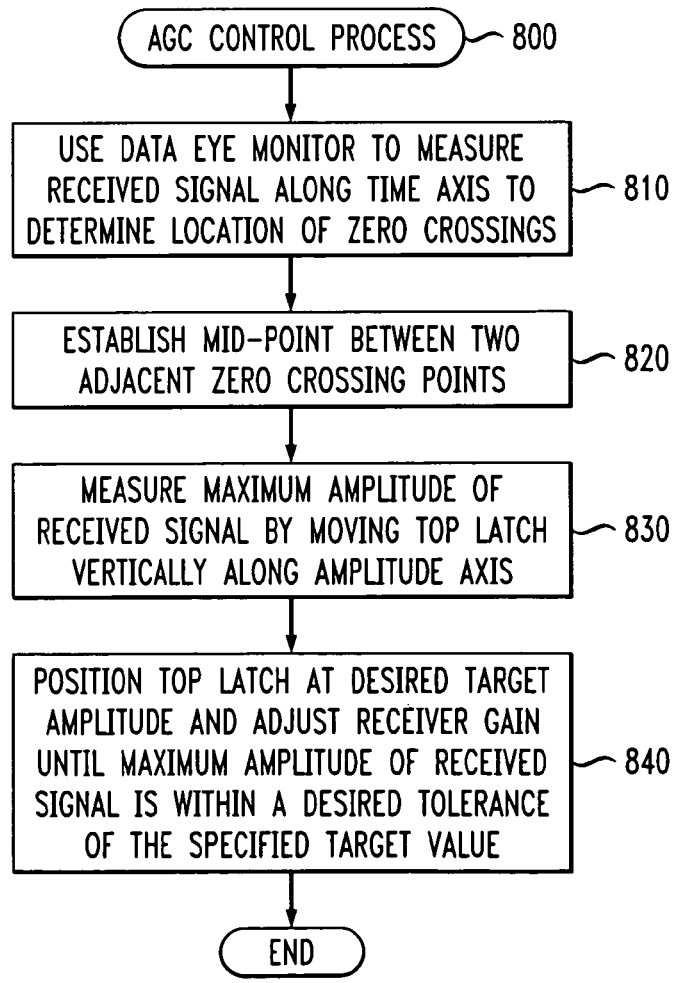
FIG. 8 is a flow chart describing an exemplary AGC control process incorporating features of the present invention.

FIG. 8 is a flow chart describing an exemplary AGC control process 800 incorporating features of the present invention. As shown in FIG. 8, the exemplary AGC control process 800 initially uses the data eye monitor to measure the received signal 110 during step 810 along the time axis to determine the location of the zero crossing points 150-1, 150-2. Thereafter, the mid-point 160 between two adjacent zero crossing points 150-1, 150-2 can be established during step 820. The established mid-point 160 is then used by the data eye monitor during step 830 to measure the maximum amplitude of the received signal 110. In one exemplary implementation, the top latch 120-top is programmed to move vertically along the amplitude axis to determine the maximum amplitude, as discussed below in conjunction with FIG. 4. Once the maximum amplitude is determined, the top latch 120-top can optionally be positioned at the desired target amplitude during step 840 and the receiver gain can be adjusted until the maximum amplitude of the received signal, as measured by the data eye monitor, is within a desired tolerance of the specified target value.

In one exemplary implementation, if both latches 120-top and 120-mid measure values of binary one, then the measured signal is in a desired range within the data eye. If, however, the central latch 120-mid measures a value of binary one and the top latch 120-top measures a value of binary zero, then the measured received signal 110 is above the desired maximum received signal level 130. In one exemplary implementation, the receiver gain is decreased until the measured received signal 110 falls below the top latch 120-top (i.e., when the top latch 120-top measures a value of one). The gain of the received signal is adjusted, for example, by adjusting the gain of the receiver pre-amplifier, in a known manner.

In an exemplary implementation, 6 bits (decimal values 0:63) are employed to encode the measured received signal level. Assume that the desired maximum received signal level 130 is 340 mV with a maximum available 6-bit reference setting of 11_111 (0×3F), and 5 millivolt (mV) per step.

Thus, the relationship between the desired maximum received signal level 130 and the measured received signal 110 can be expressed by the following equation:

$$340 \text{ mV}:0\times3F = \text{signal\_input (mV)} * \text{gain: reference setting.}$$

The above equation can also be expressed as follows:

$$\frac{\text{Ref Max}}{0 3 F} = \frac{\text{Measured Received Signal} \cdot \text{Gain Setting}}{\text{Desired Target Voltage}}$$

Thus, a user can establish the target voltage and adjust the gain in accordance with the present invention until the above equation is solved. In the exemplary embodiment, Ref Max is 340 mV.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for adjusting a gain of a received signal, comprising:
    obtaining a plurality of samples of said received signal for each of one or more variable voltage thresholds for a given unit interval;
    determining an indication of an amplitude of said received signal based on said plurality of samples and said one or more variable voltage thresholds, wherein each sample is compared to at least one of said variable voltage thresholds, wherein said determining step further comprises the steps of latching a first result of a first comparison of a sample of said received signal and a first variable threshold, latching a second result of a second comparison of a sample of said received signal and a second variable threshold, and performing an exclusive OR of said latched first comparison result and said second comparison result to estimate a value of said received signal amplitude; and
    adjusting a receiver gain based on said determined indication of amplitude.

2. The method of claim 1, wherein said latching and performing steps are executed for N steps within a unit interval.

3. The method of claim 1, wherein said latching and performing steps are executed for M voltage levels.

4. The method of claim 1, further comprising the step of determining the location of crossings of a predefined voltage level in said received signal.

5. The method of claim 1, further comprising the step of determining the location of an approximate middle point between crossings of a predefined voltage level in said received signal.

6. The method of claim 5, further comprising the step of performing said determining said indication step long said approximate middle point in said received signal.

7. A circuit for adjusting a gain of a received signal, comprising:
an amplitude monitor for obtaining a plurality of samples of said received signal for each of one or more variable voltage thresholds for a given unit interval and determining an indication of an amplitude of said received signal based on said plurality of samples and one or more variable thresholds, wherein each sample is compared to at least one of said variable voltage thresholds and adjusting a receiver gain value based on said determined indication of amplitude, and wherein said determining step further comprises the steps of latching a first result of a first comparison of a sample of said received signal and a first variable threshold, latching a second result of a second comparison of a sample of said received signal and a second variable threshold, and performing an exclusive OR of said latched first comparison result and said second comparison result to estimate a value of said received signal amplitude; and
one or more latches for storing said determined amplitude for a given unit interval.

8. The gain adjusting circuit of claim 7, wherein said latching and performing steps are executed for each of N steps within a unit interval.

9. The gain adjusting circuit of claim 7, wherein said latching and performing steps are executed for each of M voltage levels.

10. The gain adjusting circuit of claim 7, wherein said amplitude monitor is further configured to determine the location of crossings of a predefined voltage level in said received signal.

11. The gain adjusting circuit of claim 7, wherein said amplitude monitor is further configured to determine the location of an approximate middle point between crossings of a predefined voltage level in said received signal.

12. The gain adjusting circuit of claim 11, wherein said amplitude monitor is further configured to perform said determining said indication step along said approximate middle point in said received signal.

13. An integrated circuit, comprising:
a circuit for adjusting a gain of a received signal, comprising:
an amplitude monitor for obtaining a plurality of samples of said received signal for each of one or more variable voltage thresholds for a given unit interval and determining an indication of an amplitude of said received signal based on said plurality of samples and one or more variable thresholds, wherein each sample is compared to at least one of said variable voltage thresholds and adjusting a receiver gain value based on said determined indication of amplitude, and wherein said determining step further comprises the steps of latching a first result of a first comparison of a sample of said received signal and a first variable threshold, latching a second result of a second comparison of a sample of said received signal and a second variable threshold, and performing an exclusive OR of said latched first comparison result and said second comparison result to estimate a value of said received signal amplitude; and
one or more latches for storing said determined amplitude for a given unit interval.

14. The integrated circuit of claim 13, wherein said latching and performing steps are executed for each of N steps within a unit interval.

15. The integrated circuit of claim 13, herein said latching and performing steps are executed for each of M voltage levels.

16. The integrated circuit of claim 13, wherein said amplitude monitor is further configured to determine the location of crossings of a predefined voltage level in said received signal.

17. The integrated circuit of claim 13, wherein said amplitude monitor is further configured to determine the location of an approximate middle point between crossings of a predefined voltage level in said received signal.

* * * * *